US011101117B2

(12) United States Patent
Subramani et al.

(10) Patent No.: US 11,101,117 B2
(45) Date of Patent: Aug. 24, 2021

(54) METHODS AND APPARATUS FOR CO-SPUTTERING MULTIPLE TARGETS

(71) Applicant: APPLIED MATERIALS, INC., Santa Clara, CA (US)

(72) Inventors: Anantha K. Subramani, San Jose, CA (US); Hanbing Wu, Millbrae, CA (US); Wei W. Wang, Santa Clara, CA (US); Ashish Goel, Bangalore (IN); Srinivas Guggilla, San Jose, CA (US); Lavinia Nistor, Saint Martin le Vinoux (FR)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/573,265

(22) Filed: Sep. 17, 2019

(65) Prior Publication Data
US 2020/0013597 A1 Jan. 9, 2020

Related U.S. Application Data

(63) Continuation of application No. 15/240,927, filed on Aug. 18, 2016, now Pat. No. 10,468,238.

(30) Foreign Application Priority Data

Aug. 21, 2015 (IN) .......................... 2595/DEL/2015

(51) Int. Cl.
*H01J 37/34* (2006.01)
*C23C 14/34* (2006.01)
(Continued)

(52) U.S. Cl.
CPC ...... *H01J 37/3417* (2013.01); *C23C 14/3464* (2013.01); *C23C 14/564* (2013.01);
(Continued)

(58) Field of Classification Search
CPC ............... H01J 37/3447; H01J 37/3441; H01J 37/3464; H01J 37/32871; H01J 37/3417;
(Continued)

(56) References Cited

U.S. PATENT DOCUMENTS

| 4,931,169 A | 6/1990 | Scherer |
| 6,217,730 B1 | 4/2001 | Kuniaki et al. |

(Continued)

FOREIGN PATENT DOCUMENTS

| JP | H10121235 A | 1/1998 |
| WO | WO 98/31845 | 7/1998 |

(Continued)

OTHER PUBLICATIONS

International Search Report and Written Opinion dated Nov. 18, 2016 for PCT Application No. PCT/US2016/047849.

(Continued)

*Primary Examiner* — Rodney G McDonald
(74) *Attorney, Agent, or Firm* — Moser Taboada

(57) ABSTRACT

Embodiments of a method and apparatus for co-sputtering multiple target materials are provided herein. In some embodiments, a process chamber including a substrate support to support a substrate; a plurality of cathodes coupled to a carrier and having a corresponding plurality of targets to be sputtered onto the substrate; and a process shield coupled to the carrier and extending between adjacent pairs of the plurality of targets.

20 Claims, 3 Drawing Sheets

(51) Int. Cl.
    *C23C 14/56* (2006.01)
    *H01J 37/32* (2006.01)
(52) U.S. Cl.
    CPC .... *H01J 37/32871* (2013.01); *H01J 37/3429* (2013.01); *H01J 37/3441* (2013.01); *H01J 37/3447* (2013.01); *H01J 37/3464* (2013.01); *H01J 37/3485* (2013.01)
(58) Field of Classification Search
    CPC .............. H01J 37/3429; H01J 37/3485; C23C 14/3464; C23C 14/564
    USPC .................................................... 204/298.11
    See application file for complete search history.

(56) References Cited

U.S. PATENT DOCUMENTS

| | | | |
|---|---|---|---|
| 6,290,826 | B1 | 9/2001 | Hisaharu et al. |
| 2002/0144903 | A1 | 10/2002 | Kim |
| 2004/0231980 | A1 | 11/2004 | Takahashi |
| 2005/0199490 | A1 | 9/2005 | Nomura |
| 2006/0231392 | A1 | 10/2006 | Ravi et al. |
| 2009/0211897 | A1 | 8/2009 | Tsunekawa |
| 2012/0142197 | A1 | 6/2012 | Rick et al. |
| 2013/0014700 | A1 | 1/2013 | Hedge |
| 2014/0034489 | A1 | 2/2014 | Kajihara |
| 2014/0272684 | A1 | 9/2014 | Hofmann et al. |
| 2015/0034481 | A1 | 2/2015 | Ishihara |

FOREIGN PATENT DOCUMENTS

| | | |
|---|---|---|
| WO | WO 2012/033198 A1 | 3/2012 |
| WO | WO 2013/136384 | 9/2013 |

OTHER PUBLICATIONS

Supplementary European Search Report for EP Application No. 16839899, dated Mar. 11, 2019.

US 11,101,117 B2

METHODS AND APPARATUS FOR CO-SPUTTERING MULTIPLE TARGETS

CROSS-REFERENCE TO RELATED APPLICATIONS

This application is a continuation of U.S. patent application Ser. No. 15/240,927 filed on Aug. 18, 2016 which claims the benefit of Indian Patent Application No. 2595/DEL/2015, filed with the Indian Patent Office on Aug. 21, 2015, which are herein incorporated by reference in their entirety.

FIELD

Embodiments of the present disclosure relate to methods and apparatus for depositing materials on a substrate by physical vapor deposition (PVD).

BACKGROUND

Physical vapor deposition (PVD) in semiconductor fabrication is typically performed with a target made of a desired film material. In the case of alloys, the targets are typically composed of the alloy to be sputtered. In the case of new non-volatile memories, alloys of different compositions are used. As such, the inventors are investigating co-sputtering of multiple targets in a multi-cathode (e.g., multi-target) PVD chamber. However, because of the cross-contamination of the multiple targets, the targets are cleaned periodically to maintain film consistency. For example, one or more of the multiple targets may be covered by shutters during the cleaning process, which may lead to particle generation.

Therefore, the inventors have provided embodiments of methods and apparatus for improved co-sputtering of multiple target materials in a PVD processing system.

SUMMARY

Embodiments of a method and apparatus for co-sputtering multiple target materials are provided herein. In some embodiments, a process chamber including a substrate support to support a substrate; a plurality of cathodes coupled to a carrier and having a corresponding plurality of targets to be sputtered onto the substrate; and a process shield coupled to the carrier and extending between adjacent pairs of the plurality of targets.

In some embodiments, a physical vapor deposition (PVD) chamber includes a substrate support to support a substrate; a plurality of targets disposed opposite the substrate support, each target comprising a material to be sputtered onto the substrate; and a shield rotatably disposed between the substrate support and the plurality of targets, wherein the shield includes two or more holes sized and positioned to simultaneously expose a set of two or more of the plurality of targets while covering the remainder of the plurality of targets, wherein different sets of two or more of the plurality of targets can be exposed while covering the remainder of the plurality of targets by selection of the rotational position of the shield.

In some embodiments, a method of processing a substrate includes exposing a first set of a plurality of targets through two or more holes of a shield, wherein the shield is rotatably coupled to a carrier disposed above a substrate support supporting a substrate; and co-sputtering the first set of the plurality of targets.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
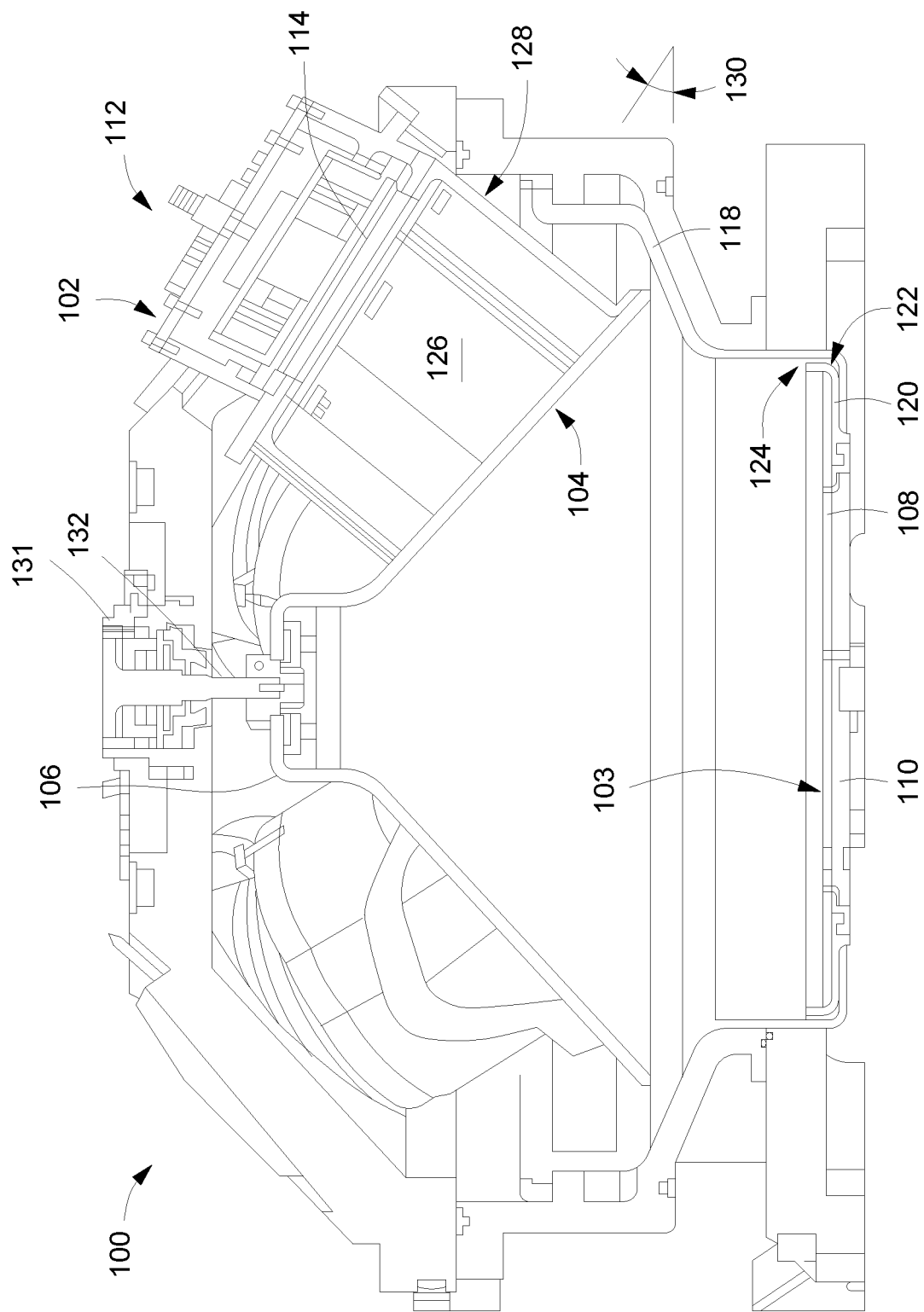
FIG. 1 depicts a cross-sectional view of a multi-cathode processing chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for co-sputtering multiple target materials are provided herein. The disclosed methods and apparatus may advantageously allow co-sputtering of a plurality of targets while substantially minimizing or eliminating cross-contamination between targets.

In some embodiments, a multi cathode-PVD chamber includes a plurality of cathodes, or targets, (for example, 5 cathodes) attached to a top adapter. Each cathode can have a DC/Pulse DC or RF target and an associated magnetron. Each cathode also has a shroud which is long tube which does not block a line of sight from the target to wafer. A common rotating shield is provided in the center of the chamber that is shared by all the cathodes. Depending on the number of targets that need to be sputtered at the same time, the rotating shield can have one or more holes, such as 1, 2, or 3 holes. The shroud surrounding each target advantageously captures a majority of the target flux that is not directed towards the wafer and hence likely to land on the wafer, thus significantly minimizing target cross-contamination. In some embodiments, the shroud material and surface treatment can be tailored to a specific target material being sputtered, thus improving defect performance.

In some embodiments, a process shield can be provided to divide the process cavity into a number of sections corresponding to each cathode target. The process shield advantageously similarly limits or eliminates cross-contamination but with no rotating parts. For example, in some embodiments where five cathodes are provided, the process cavity can be divided into 5 equal sections with a process shield that is shaped like a star. The process shield is as long as possible to avoid cross talk. In some embodiments, the process shield can have Z-Theta motion. In such embodiments, the process shield can be positioned at different cathodes during deposition on the wafer. Then during a paste step the process shield can be rotated to a different cathode. The deposited stress from materials from the deposition and paste cathodes can cancel each other or at least reduce stress in the film deposited on the process shield, thus yielding a very low stress film with very good particle performance. When using a process shield as described herein, flexibility of co-sputtering from any number of cathodes is possible.

FIG. 1 depicts a cross-sectional view of a multi-cathode process chamber (process chamber 100) in accordance with some embodiments of the present disclosure. The process chamber 100 includes a plurality of cathodes 102 coupled to an upper portion of the process chamber 100, a rotating shield 106 to selectively cover one or more of the plurality of cathodes 102, and a substrate support 110 disposed within the process chamber 100 below the plurality of cathodes 102. In some embodiments, the substrate support 110 may be a rotating pedestal. In some embodiments, the substrate support 110 may be vertically movable.

The plurality of cathodes 102 can be used for sputtering different materials on a substrate 108. In some embodiments, the substrate 108 is a structure having a semiconductor material used for fabrication of integrated circuits. For example, the substrate 108 can represent a semiconductor structure including a wafer.

The cathodes 102 are exposed through openings or holes 104 of the rotating shield 106, which are disposed over the substrate 108 on the substrate support 110. Materials from the cathodes 102 can be deposited onto the substrate 108 (e.g., materials 103 as shown in FIG. 1) through the holes 104.

Figure 1A:
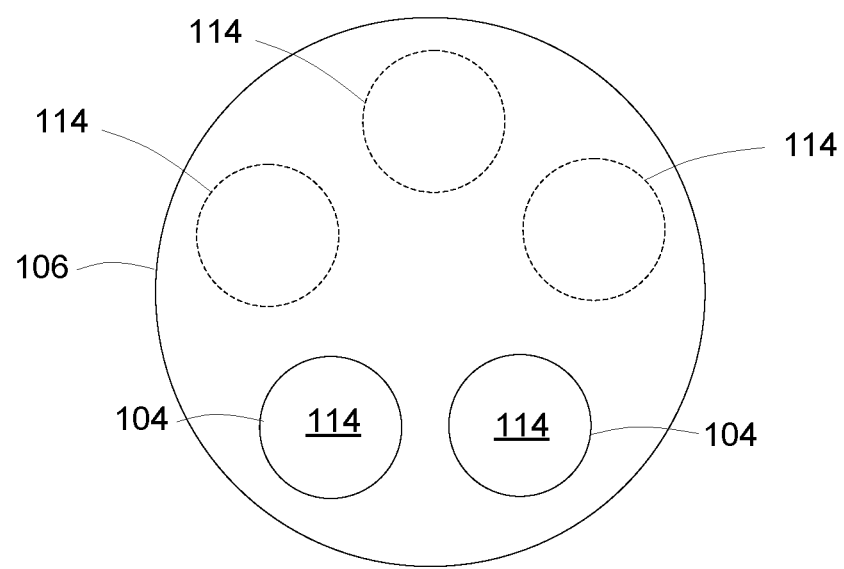
FIG. 1A depicts a bottom schematic view of a rotating shield in the multi-cathode processing chamber of FIG. 1.

A power supply 112 may be coupled to each of the plurality of cathodes 102. The power supply 112 may include direct current (DC), pulsed DC, or radio frequency (RF) power. The rotating shield 106 may expose two or more of the plurality of cathodes 102 and shield remaining cathodes 102 from cross-contamination during sputtering. The cross-contamination results from physical movement or transfer of a deposition material from one of the cathodes 102 to another one of the cathodes 102. Each cathode 102 is positioned over a corresponding target 114. Depending on the number of targets 114 that need to be sputtered, the rotating shield 106 may have two or more holes 104 to selectively expose corresponding ones or more targets to be co-sputtered (two holes illustratively shown in FIG. 1A). To sputter selected targets, the rotating shield 106 is rotated to expose the selected targets to be sputtered. The targets 114 may be formed of any material desired to be sputtered onto the substrate 108. A motor 131 is coupled to the rotating shield 106 via a shaft 132 to facilitate the rotation of the rotating shield 106.

In some embodiments, each cathode 102 includes a shroud 126 which is a long tube that does not block a line of sight from the target 114 to a substrate disposed on the substrate support 110. Each shroud 126 includes a shroud rotation 128 to provide the cathodes 102 at an angle 130 of about 20 to 90 degrees. Different values of the angle 130 provide different uniformity profiles on a surface of the substrate. The angle 130 is measured between a plane of one of the targets 114 and a plane of the substrate support 110. Each shroud is configured to capture a majority of the target flux that is not directed towards and hence likely to land on substrate. As such, the shrouds significantly minimize target cross contamination. Additionally, the shroud material and surface treatment of the shroud may be tailored to specific target materials, thus improving defect performance.

Before the substrate 108 moves into or out of the chamber, the substrate 108 can move below a conical shield 118 disposed on a lower portion of the process chamber. A telescopic cover ring 120 is disposed on top of the conical shield 118 and surrounds the substrate 108. When the substrate support 110 moves down, the substrate 108 can be lifted up with a robotic arm before the substrate 108 moves out of the chamber.

The telescopic cover ring 120 can include a ring portion 122 that curves up and has a predefined thickness to form a dish or bowl in which the substrate can be disposed with the ring portion 122 surrounding and disposed above the substrate 108. The telescopic cover ring 120 can also include a predefined gap 124 and a predefined length with respect to the conical shield 118. Thus, when materials 103 are deposited on the substrate 108, the materials 103 are prevented or substantially prevented from depositing below the substrate support 110 or outside of the conical shield 118. Controlling the deposition of materials 103 as described advantageously prevents or reduces the spread of contaminants to the substrate 108 or within the process chamber.

Figure 2:
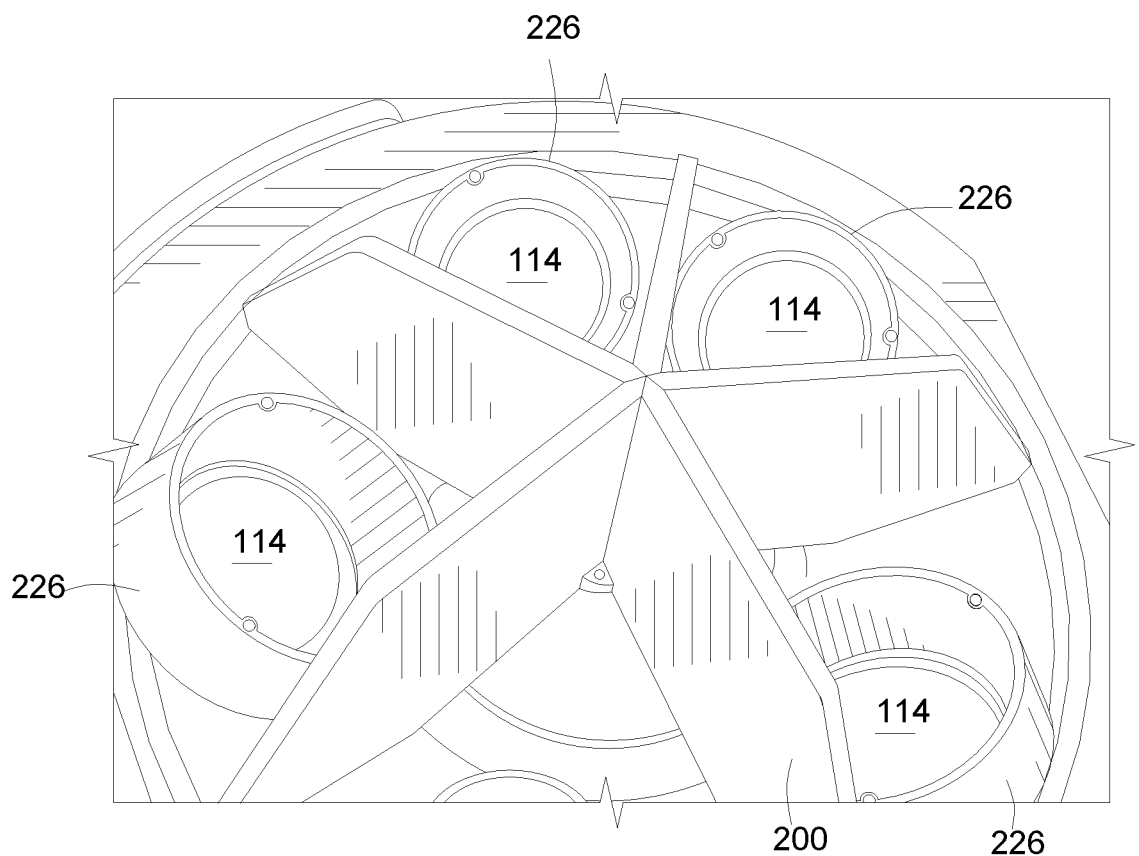
FIG. 2 depicts an isometric view of a shield for use in a multi-cathode processing chamber in accordance with some embodiments of the present disclosure.

FIG. 2 depicts an isometric view of an alternative shield for use in a multi-cathode process chamber, such as the process chamber 100, which can be used in place of the rotating shield 106. In some embodiments, a process shield (process shield 200) may be used to achieve similar results as the rotating shield 106, described above, but without any rotating parts. In such embodiments, the process shield 200 extends between adjacent pairs of targets. In some embodiments, the process shield 200 may comprise several walls disposed between adjacent targets. In some embodiments, and as shown in FIG. 2, the process shield 200 may be star-shaped, for example, comprising several walls coupled at a centerline and extending radially outward toward the edges of the process cavity to prevent a direct line of site from a given target to any of the other targets. In some embodiments, the process shield 200 may further include an outer wall (not shown) connecting the walls extending outward from the centerline to surround each target. In some embodiments, the plurality of targets includes five targets and the process cavity is divided into five equivalent sections by the process shield 200. The process shield 200 has a length sufficient to avoid cross talk between targets 114. In some embodiments, all of the targets 114 may be exposed so that any of the targets 114 may be selected for sputtering. In the embodiment in which all of the targets are exposed, the process shield 200 significantly reduces contamination of a non-sputtered target by a sputtered target by an order of magnitude more than without any shield or shrouds. In addition, the process shield 200 advantageously allows for the flexibility of choosing any one or more of targets to be sputtered without having to move any parts to selectively expose the targets to be sputtered.

In some embodiments, the process shield 200 may optionally have Z-Theta motion, so that sections of the process shield 200 may be positioned at different cathodes 102 during deposition on the substrate and, subsequently, rotated to different cathodes 102 during a paste step. The Z-theta motion comprises vertical movement of the process shield 200 followed by rotational movement to selectively expose a given section of the process shield 200, which was originally surrounding one of the targets 114, to a different one of the targets 114. The stress associated from deposition of materials from the deposition and paste cathodes at least partially offset each other, advantageously yielding a very low stress film with improved particle performance. For example, materials deposited on a given section of the process shield 200 during a first step may exhibit a tensile stress. To offset the tensile stress in the material deposited on the given section, the process shield 200 is rotated so that the given section is disposed around a cathode yielding a material that exhibits a compressive stress. As a result, the tensile and compressive forces from the two different materials deposited on the given section offset each other. Thus, when using the process shield 200, flexibility of co-sputtering from any number of cathodes is possible.

In some embodiments, the cathodes 102 do not include shrouds since the process shield 200 significantly reduces or eliminates cross-contamination of targets 114 being co-sputtered. In some embodiments, each cathode 102 may alternatively include a shroud 226, which is shorter than the shrouds 126 depicted in the FIG. 1. The shrouds 226 may advantageously significantly reduce or eliminate contamination of the top adapter. For example, the shrouds 226 may be between about 1 inch long as opposed to the shrouds 126, which may be between about 5 inches and about 6 inches long. In some embodiments, the shrouds 226 may be formed of aluminum or any other metal that has desirable thermal conductivity and surface finish to facilitate adherence of the sputtered material onto the shroud. In some embodiments, the shrouds 226 may be texturized to improve particle adhesion. For example, the shrouds 226 may be bead-blasted or coated with a coating to facilitate adherence of the sputtered material onto the shroud. In some embodiments, the shrouds 126 of FIG. 1 may be similarly texturized. In some embodiments, for example, the coating may be formed of an aluminum arc spray, a tantalum arc spray, a molybdenum arc spray, or the like.

Although depicted as star-shaped, the process shield 200 have any shape that divides each cathode 102 into a separate space without interfering with the deposition of the sputtered material onto the substrate being processed. For example, assuming each target 114 has a diameter of about 6 inches, the star shaped process shield 200 has a height less than about 15 inches. The more the height of the process shield 200 exceeds 15 inches, the more process shield 200 begins to interfere with the deposition of the sputtered material onto the substrate being processed. If the target diameter is greater than 6 inches, then the height of the process shield 200 may also be greater than 15 inches without adversely affecting the deposition process. In other words, the height of the process shield 200 is proportional to the diameter of each of the targets. In any case, each target has a diameter at least half of the diameter of the substrate to be processed.

Figure 3:
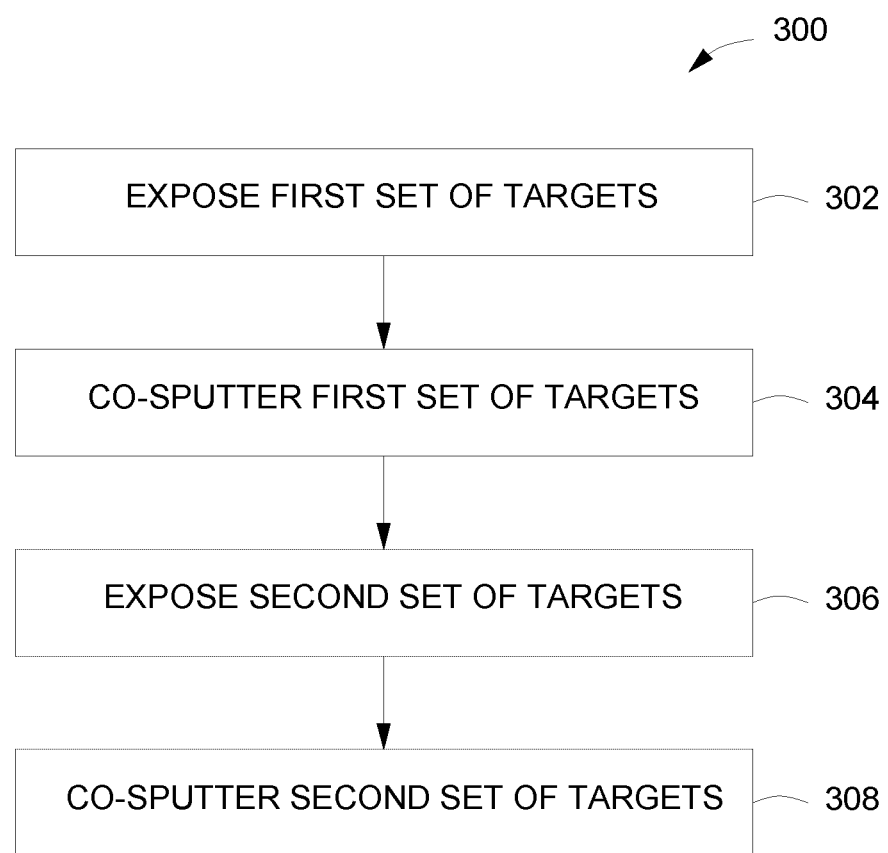
FIG. 3 is a flowchart depicting a method of processing a substrate in accordance with some embodiments of the present disclosure.

FIG. 3 is a flow chart depicting a method of co-sputtering a plurality of targets. At 302, a first set of a plurality of targets is exposed through two or more holes of a process shield (e.g., rotating shield 106) while the remaining targets are covered by the shield.

At 304, the first set of targets is co-sputtered. For example, DC or RF energy may be applied to each of the first set of targets to sputter material from the first set of targets onto the substrate. In some embodiments, a process gas is supplied into the chamber, a plasma is formed from the process gas using RF energy supplied from each respective cathode, and ions from the plasma are caused to bombard the target to sputter materials from the respective target onto the substrate.

Optionally at 304, if another set of targets, different than the first set, is to be sputtered, the shield 106 is rotated to expose a second set of the plurality of targets while covering the remaining targets (i.e., the first set of targets and/or additional ones of the plurality of targets).

At 306, the second set of targets is co-sputtered in a similar manner as the first set of targets, as detailed above. Because each target 114 includes a corresponding shroud 126, the accumulation of target material on a given shroud corresponds to one target. As such, cross-contamination is advantageously avoided. In some embodiments, targets that are not exposed through holes in the shield 106 may be sputtered onto the backside of the shield 106 in a cleaning process so that a cleaner film may be deposited onto the substrate from the cleaned target.

In embodiments in which the process shield 200 is utilized, the plurality of targets are all exposed and one or more of the targets are sputtered, as desired. That is, the method for co-sputtering targets using the process shield 200 is similar to the method 300, except that there is no need to expose a first and second set of targets to co-sputter each set. Instead, because all the targets are exposed in the embodiments in which the process shield 200 is used, a first set of the plurality of targets 114 is co-sputtered and, subsequently, a second set (different than the first set) of the plurality of targets 114 is co-sputtered. Because the process shield 200 is of sufficient height to avoid cross-contamination of the targets, rotation of the shield is not necessary to selectively expose different sets of targets. Thus, throughput is advantageously increased. In some embodiments, the process shield 200 may be coupled to the rotating shield 106 to provide further protection from cross-contamination.

While the foregoing is directed to embodiments of the present disclosure, other and further embodiments of the disclosure may be devised without departing from the basic scope thereof.

The invention claimed is:

1. An apparatus for a process chamber with a plurality of targets, comprising:
   a process shield configured to be coupled to a carrier coupled to the plurality of targets, wherein the process shield is configured to extend between adjacent pairs of the plurality of targets and to move vertically and rotate with respect to the plurality of targets.

2. The apparatus of claim 1, wherein the process shield is star-shaped.

3. The apparatus of claim 1, wherein the plurality of targets includes five targets.

4. The apparatus of claim 1, wherein the process shield is configured to expose all of the plurality of targets.

5. The apparatus of claim 4, wherein a height of the process shield is proportional to a diameter of each of the plurality of targets.

6. The apparatus of claim 5, wherein each of the plurality of targets have a diameter of approximately 6 inches, and wherein the process shield has a height of less than approximately 15 inches.

7. The apparatus of claim 1, further comprising:
   a plurality of shrouds, each surrounding a corresponding one of the plurality of targets.

8. The apparatus of claim 7, wherein each of the plurality of shrouds has a height of approximately 1 inch.

9. The apparatus of claim 7, wherein the plurality of shrouds are formed of aluminum.

10. The apparatus of claim 9, wherein the plurality of shrouds are texturized to improve particle adhesion of the plurality of shrouds.

11. The apparatus of claim 7, wherein each of the plurality of shrouds has a height of approximately 5 inches to approximately 6 inches.

12. An apparatus for a process chamber with a plurality of targets, comprising:
   a shield configured to be coupled to a carrier coupled to the plurality of targets, to extend between adjacent pairs of the plurality of targets, to move vertically and rotate with respect to the plurality of targets, and to expose the plurality of targets through the shield; and a plurality of shrouds which are configured to surround a corresponding one of the plurality of targets.

13. The apparatus of claim 12, wherein the plurality of targets includes five targets.

14. The apparatus of claim 12, wherein the plurality of shrouds are configured to extend towards a substrate support of the process chamber.

15. The apparatus of claim 14, wherein the plurality of shrouds are formed of aluminum.

16. The apparatus of claim 15, wherein the plurality of shrouds are texturized to improve particle adhesion of the plurality of shrouds.

17. The apparatus of claim 16, wherein the plurality of shrouds include one of an aluminum, a tantalum, or a molybdenum coating.

18. The apparatus of claim 12, wherein each of the plurality of shrouds has a height of approximately 5 inches to approximately 6 inches.

19. The apparatus of claim 12, wherein the shield is configured to move vertically with respect to the plurality of targets before rotating.

20. An apparatus for a process chamber with a plurality of targets, comprising:

a shield configured to be coupled to a carrier coupled to the plurality of targets, to extend between adjacent pairs of the plurality of targets, to move vertically and rotate with respect to the plurality of targets, and to expose the plurality of targets through the shield; and a plurality of shrouds which are configured to surround a corresponding one of the plurality of targets and to extend downward towards a substrate support of the process chamber, and wherein the plurality of shrouds have a height of approximately 5 inches to approximately 6 inches, and wherein the shield is configured to move vertically with respect to the plurality of targets before rotating.

* * * * *